(12) United States Patent
Hamaya et al.

(10) Patent No.: US 9,748,081 B2
(45) Date of Patent: Aug. 29, 2017

(54) METHOD OF MANUFACTURING SEMICONDUCTOR DEVICE AND SPUTTERING APPARATUS

(71) Applicant: RENESAS ELECTRONICS CORPORATION, Tokyo (JP)

(72) Inventors: Takashi Hamaya, Tokyo (JP); Hideaki Tsugane, Tokyo (JP); Hidenori Suzuki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/862,015

(22) Filed: Sep. 22, 2015

(65) Prior Publication Data

US 2016/0086779 A1 Mar. 24, 2016

(30) Foreign Application Priority Data

Sep. 22, 2014 (JP) ................................. 2014-192478

(51) Int. Cl.
*C23C 14/35* (2006.01)
*H01J 37/34* (2006.01)
*H01L 29/49* (2006.01)
*H01L 21/8238* (2006.01)

(52) U.S. Cl.
CPC ...... *H01J 37/3447* (2013.01); *H01J 37/3405* (2013.01); *H01L 29/49* (2013.01); *H01L 21/823814* (2013.01)

(58) Field of Classification Search
CPC ... H01J 37/3405; H01J 37/3447; H01L 29/49; C23C 14/35; C23C 14/564

USPC .................. 204/192.12, 192.17, 298.11
See application file for complete search history.

(56) References Cited

U.S. PATENT DOCUMENTS 5,650,052 A * 7/1997 Edelstein ................ C23C 14/34
                                                       204/192.12
6,740,585 B2 * 5/2004 Yoon ..................... C23C 14/566
                                                       257/E21.165
6,780,294 B1 * 8/2004 Hixson .................. C23C 14/564
                                                       118/504

FOREIGN PATENT DOCUMENTS

JP     07-307288        * 11/1995
JP     09-176847        *  7/1997
WO    2004/047160 A1     6/2004

OTHER PUBLICATIONS

Machine Translation 09-176847 dated Jul. 1997.*
Machine Translation 07-307288 dated Nov. 1995.*

* cited by examiner

*Primary Examiner* — Rodney McDonald
(74) *Attorney, Agent, or Firm* — McDermott Will & Emery LLP

(57) ABSTRACT

Reliability of a semiconductor device is improved, and use efficiency of a sputtering apparatus is increased. When depositing thin films over a main surface of a semiconductor wafer using a magnetron sputtering apparatus in which a collimator is installed in a space between the semiconductor wafer and a target installed in a chamber, a region inner than a peripheral part of the collimator is made thinner than the peripheral part. Thus, it becomes possible to suppress deterioration in uniformity of the thin film in a wafer plane, which may occur as the integrated usage of the target increases.

16 Claims, 13 Drawing Sheets

METHOD OF MANUFACTURING SEMICONDUCTOR DEVICE AND SPUTTERING APPARATUS

CROSS-REFERENCE TO RELATED APPLICATIONS

The disclosure of Japanese Patent Application No. 2014-192478 filed on Sep. 22, 2014 including the specification and drawings and abstract is incorporated herein by reference in its entirety.

BACKGROUND

The present invention relates to a technology for a method of manufacturing a semiconductor device. In particular, it relates to a technology which is effective when applied to the manufacture of a semiconductor device including a process of depositing thin films over a semiconductor wafer with use of a sputtering technique. Further, the present invention relates to a sputtering apparatus and, in particular, it relates to a technology which is effective when applied to the puttering apparatus having a collimator.

Among manufacturing processes of a semiconductor device, the sputtering apparatus is widely used in a process of depositing a conductive thin film for an integrated circuit over a semiconductor wafer (hereafter, also simply called a "wafer").

As one of the thin film formation techniques using this kind of sputtering apparatus, there is known a collimate sputtering technique in which a disc-like member with numbers of through holes called a collimator is arranged between a wafer and a target provided in a sputtering chamber.

The collimate sputtering technique is the one in which sputtered particles entering a main surface of the wafer obliquely from the target is reduced by the collimator and sputtered particles having many vertical components are allowed to enter the wafer so that coverage, for example, at the bottom portion of a connection hole with a high aspect ratio can be improved.

Since wafers are becoming larger in diameter these years, in a thin-film formation process using a sputtering apparatus, uniformity of the film thickness distribution between a central part and a peripheral part of the wafer has been deteriorated significantly.

As one of the measures to cope with the situation, Patent Document 1 (International Publication WO2004/047160) discloses a technique in which, among numbers of through holes provided in the collimator, an aspect ratio (depth of a hole/diameter) of through holes located on a central part side of the collimator is made higher than that of through holes located on a peripheral part side of the collimator.

According to the technique disclosed in Patent Document 1, the amount of sputtered particles passing through the through holes of the collimator becomes larger on the peripheral part side than on the central part side of the collimator. Therefore, it can be expected that relative shortage of the film thickness in the peripheral part of the wafer is compensated and uniformity of the film thickness distribution in a wafer plane is improved.

PATENT DOCUMENT 1

International publication WO2004/047160

SUMMARY

The study conducted by the present inventors has revealed that, in an ordinarily employed collimate sputtering technique, as the integrated usage of the target increases, thin films deposited over a central part of a wafer tend to become gradually thinner than those deposited over a peripheral part of the wafer.

When such a phenomenon occurs, uniformity of the thin film in the wafer plane is deteriorated. Further, for example, the incidence of variations in resistance of a silicide film and junction leaks becomes high. For this reason, as a countermeasure, the target has to be replaced with a new one earlier, inevitably lowering use efficiency of the target.

An object of the invention disclosed in the present application is to increase use efficiency of a sputtering apparatus.

Also, another object thereof is to improve reliability of a semiconductor device.

The aforementioned and other objects and novel features of the present invention will be apparent from the description herein and accompanying drawings.

In a manufacturing method of a semiconductor device according to one embodiment, when depositing a thin film over a semiconductor wafer with use of a sputtering apparatus having a collimator installed in a space between the semiconductor wafer and a target, the collimator is configured such that a region inner than a peripheral part of the collimator is thinner than the peripheral part.

Further, the sputtering apparatus according to one embodiment includes a wafer stage installed in a chamber and the collimator having a plurality of through holes, and the peripheral part of the collimator is thicker than the region inner than the peripheral part.

As a result of the above, the use efficiency of the sputtering apparatus can be improved. According to one embodiment, it becomes possible to suppress deterioration in uniformity of the thin film in the wafer plane, which may occur as the integrated usage of the target increases, and to improve the use efficiency of the target.

Also, reliability of the semiconductor device can be improved. According to one embodiment of the invention, it becomes possible to reduce the incidence of variations in resistance of the silicide film and the junction leaks.

BRIEF DESCRIPTION OF THE DRAWINGS

FIGS. 2A and 2B show a collimator used in First Embodiment, in which FIG. 2A is a plan view of the collimator and FIG. 2B is a cross-sectional view taken along line A-A of FIG. 2A;

FIGS. 17A and 17B show a collimator used in Third Embodiment, in which FIG. 17A is a plan view of the collimator, and FIG. 17B is a cross-sectional view taken along line B-B of FIG. 17A.

DETAILED DESCRIPTION

Hereafter, embodiments of the present invention will be explained in detail based on the accompanying drawings. Also, components having the same function are denoted by the same or related reference symbols throughout all the drawings for describing the embodiments, and the repetitive description thereof will be omitted. In addition, the description of the same or similar portions is not repeated in principle unless particularly required in the embodiments described below. Furthermore, in some drawings used in the embodiments, hatching is omitted even in a cross-sectional view so as to make the configuration easy to understand in some cases.

First Embodiment

Figure 1:
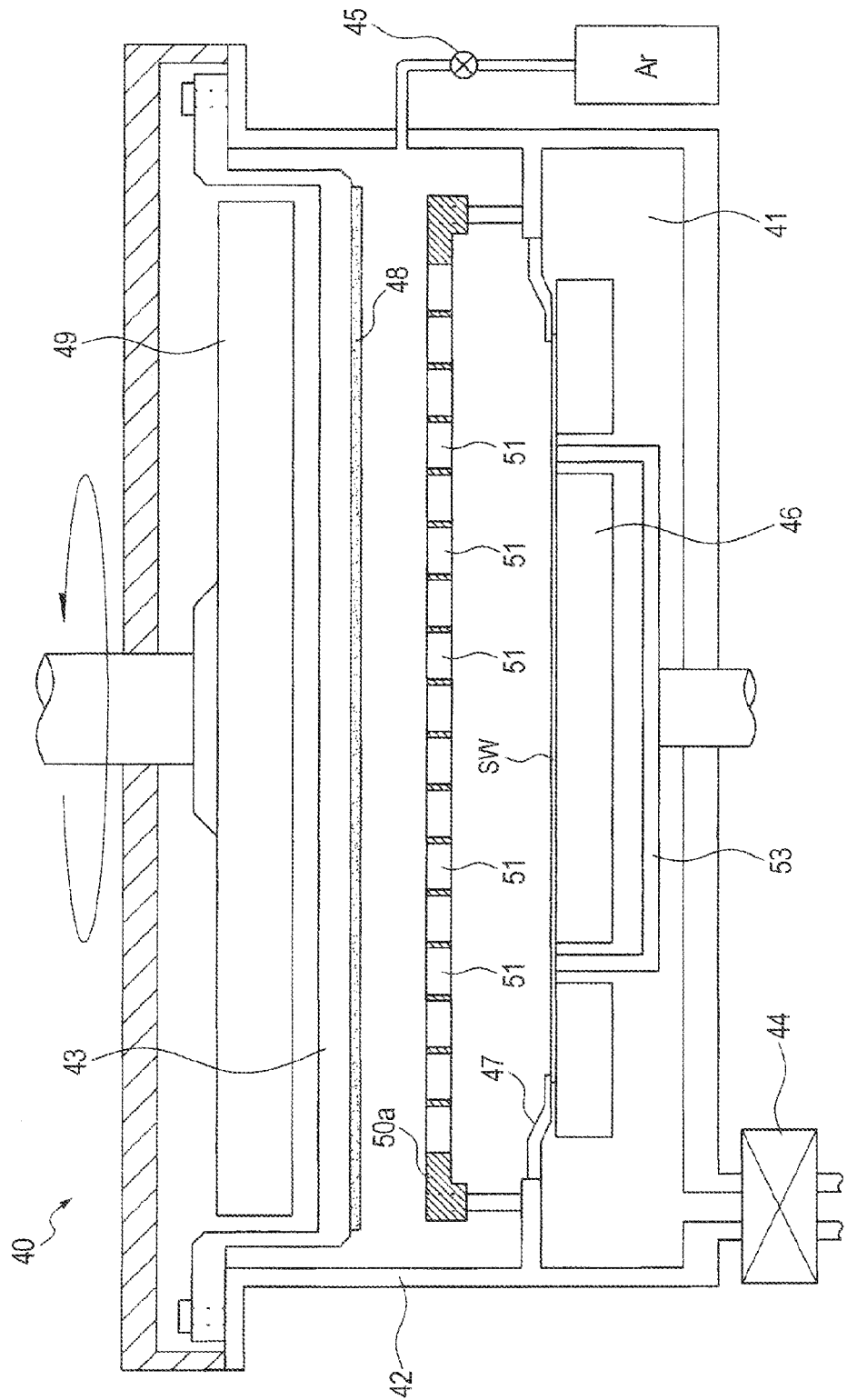
FIG. 1 is a block diagram showing a principal part of a magnetron sputtering apparatus used in First Embodiment.

FIG. 1 is a block diagram showing a principal part of a magnetron sputtering apparatus used in the present embodiment.

The sputtering apparatus 40 includes a chamber 41 which is a film deposition container. An inner space of the chamber 41 is sealed with a shield 42 and a backing plate 43 covering an upper portion thereof, and is set to be under a desired pressure (degree of vacuum) by a vacuum pump 44, such as a cryopump and a dry pump. Into the chamber 41, a sputtering gas, such as an Ar (argon) gas, is supplied at a desired rate of flow through a mass flow controller 45.

In the center of the chamber 41, there are installed a support table (wafer stage) 46 for supporting a semiconductor wafer SW and a vertically movable lifter 53 for installing the semiconductor wafer SW over the wafer stage 46. The semiconductor wafer SW is mounted over an upper surface of the wafer stage 46 with its main surface facing upward and is fixed to the wafer stage 46 by a covering 47. The semiconductor wafer SW includes, for example, a single-crystal silicon substrate having a diameter of 300 mm and a thickness of about 0.7 to 0.8 mm, for example. The semiconductor wafer SW mounted over the upper surface of the wafer stage 46 is heated to a desired temperature by a heater (not shown) which is built in the wafer stage 46.

Above the wafer stage 46, there is arranged a target 48 supported by the backing plate 43 so as to oppose the semiconductor wafer SW over the wafer stage 46. The target 48 is a disc-like thin plate of a high purity metal or alloy having a thickness of about 3 mm, and is fixed to a bottom surface of the backing plate 43 by metal bonding or diffusion bonding. The target 48 fixed to the backing plate 43 and its bottom surface form a cathode (negative pole) to which a direct-current voltage or a high frequency voltage is impressed.

In an upper portion of the backing plate 43, there is installed a magnet part 49 in which a magnet (permanent magnet) is housed near the target 48 for producing a magnetic field perpendicularly to the electric field. The magnetic field produced by the magnet part 49 promotes ionization collision between electrons emitted from the target 48 forming the cathode and the Ar gas, and serves to efficiently draw Ar ions onto the surface of the target 48 and allow the surface to be sputtered. The magnet part 49 is attached to the upper portion of the backing plate 43 in a state of being rotatable in a horizontal plane so that the surface of the target 48 is uniformly sputtered.

A collimator 50a is installed in a space between the target 48 fixed to the bottom surface of the backing plate 43 and the semiconductor wafer SW over the wafer stage 46. The collimator 50a is a disc-like metal plate of Ti (titanium), SUS (stainless steel), etc. in which numbers of through holes 51 are made and its diameter is larger than the semiconductor wafer SW. A peripheral part of the collimator 50a is screwed to the shield 42 of the chamber 41 so that it may be parallel to both an undersurface of the target 48 and a main surface of the semiconductor wafer SW.

When the collimator 50a is arranged in the space between the semiconductor wafer SW and the target 48, sputtered particles show the following behaviors. That is, among the sputtered particles kicked out from the surface of the target 48 due to the collision of the Ar ions, sputtered particles flying at an oblique angle greater than a prescribed angle with respect to the main surface of the semiconductor wafer SW collide with inner walls of the through holes 51 of the collimator 50a and do not reach the semiconductor wafer SW. In other words, only the sputtered particles flying vertically or at an angle close to it with respect to the main surface of the semiconductor wafer SW pass through the through holes 51 and reach the main surface of the semiconductor wafer SW. Thus, sputtered particles having many vertical components are allowed to enter the main surface of the semiconductor wafer SW. Therefore, it becomes possible to improve coverage, for example, at the bottom portion of a connection hole having a high aspect ratio. Also, the collimator 50a has a function of capturing charged particles (mainly electrons). Therefore, by arranging the collimator 50a in the space between the semiconductor wafer SW and the target 48, it is possible also to obtain an effect of reducing the plasma damage given to the semiconductor wafer SW.

Figure 18:
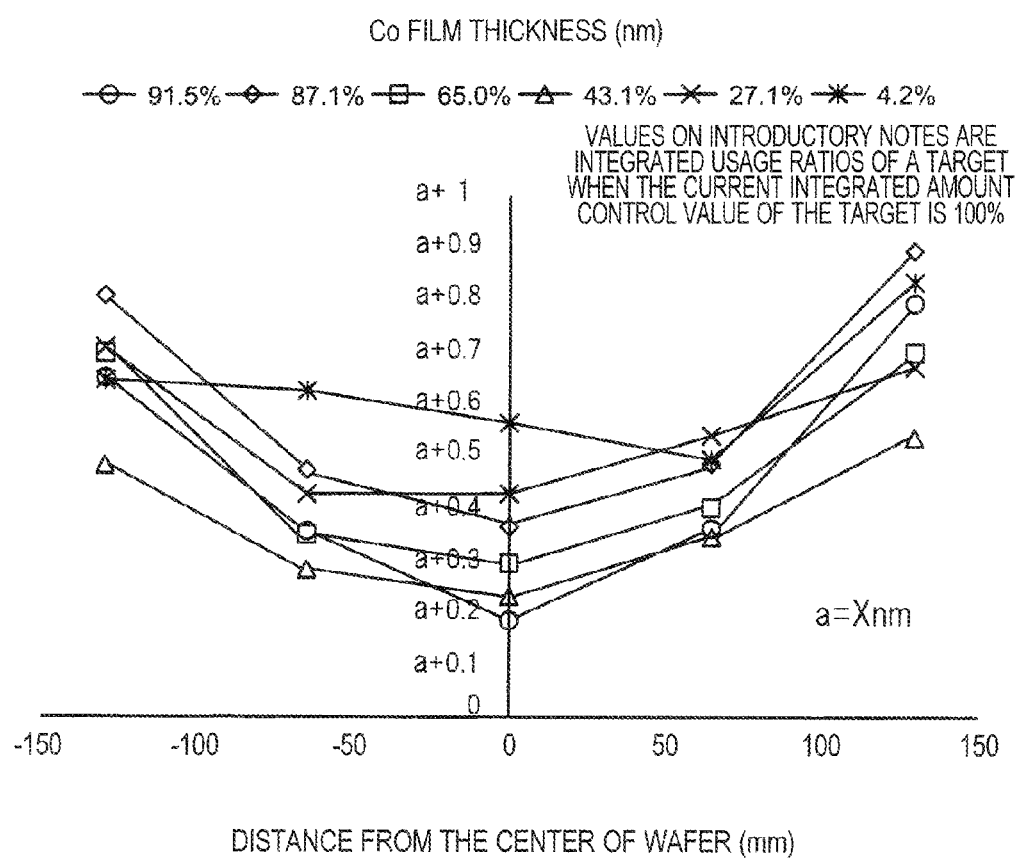
FIG. 18 is a graph showing the relationship between a distance from the center of a semiconductor wafer and a film thickness of a thin film for each integrated usage ratio of the target.

Incidentally, in an ordinarily employed sputtering apparatus using a collimator, the present inventors have found out the following. That is, when the integrated usage of the target increases, as shown in FIG. 18, thin films deposited over a central part of a semiconductor wafer gradually become thinner than those deposited over a peripheral part of the semiconductor wafer, which is mainly caused by the two factors given below.

The first factor includes changes in the advancing direction and amount of the sputtered particles caused by a change in the form of erosion (electric erosion) produced while the target is in use.

The film thickness distribution of thin films deposited over the semiconductor wafer depends upon a distribution of erosion regions (a range where target forming elements are kicked out in a sputtering phenomenon and the target is consumed) over a surface of the target. In the case of the magnetron sputtering apparatus in which sputtering is performed while rotating the magnet arranged above the target, erosion peaks of the target are produced over concentric circles along a trajectory of the rotating magnet. However, when the integrated usage of the target increases and the erosion regions extend in a thickness direction of the target, the advancing direction and amount of the sputtered particles change from an initial state of the target. As a result, although depending on how the magnet is arranged, there are cases where thin films deposited on a central part side of the semiconductor wafer become thinner than those deposited on a peripheral part side.

The second factor includes changes in the advancing direction and amount of the sputtered particles caused by a change in the form of the through hole of the collimator brought about while the target 48 is in use.

As described above, among the sputtered particles kicked out from the surface of the target by the collision of the Ar ions, the sputtered particles (oblique-direction sputtered particles) flying at an oblique angle greater than the prescribed angle with respect to the main surface of the semiconductor wafer collide with the inner walls of the through holes of the collimator and do not reach the semiconductor wafer. In this regard, while such oblique-direction sputtered particles enter the through holes arranged near the central part of the collimator, oblique-direction sputtered particles enter the through holes arranged near the peripheral part of the collimator only from specific directions (from directions around the central part of the collimator).

As a result, when the integrated usage of the target increases, the amount of sputtered particles adhering to sidewalls of the through holes arranged near the central part of the collimator relatively increases. That is, diameters of the through holes arranged near the central part of the collimator become smaller (aspect ratios become higher) than those of the through holes arranged near the peripheral part. Consequently, as the integrated usage of the target increases, the number of the sputtered particles passing through the through holes arranged near the central part of the collimator and reaching the semiconductor wafer relatively decreases, and thin films deposited over a central part of the semiconductor wafer become thinner than those deposited over a peripheral part.

Figure 2A:
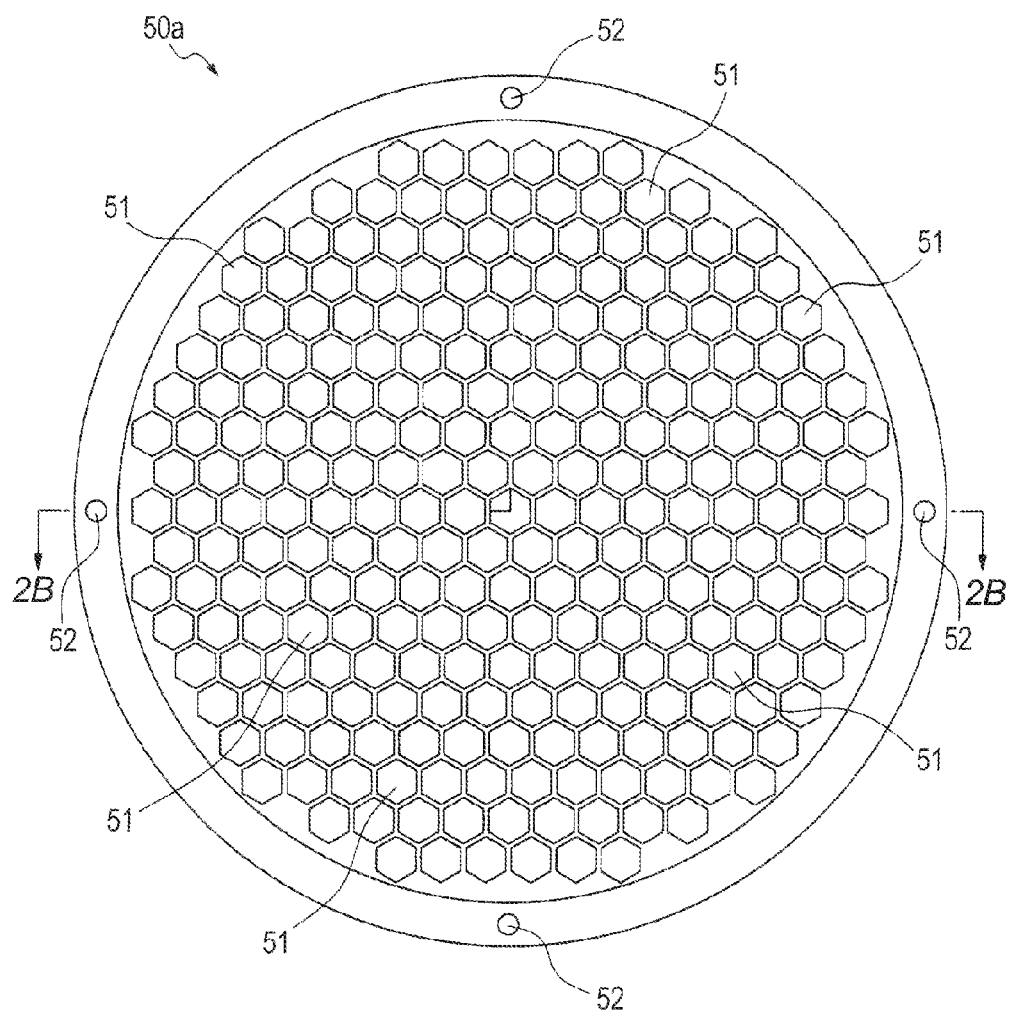
Figure 2B:
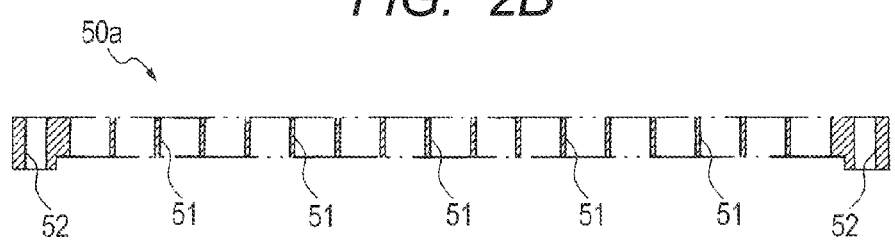

In view of the above, according to the present embodiment, arrangements as follows are worked out in the collimator 50a. FIGS. 2A and 2B shows the collimator 50a, in which FIG. 2A is a plan view of the collimator 50a and FIG. 2B is a cross-sectional view taken along line A-A of FIG. 2A.

As shown in FIG. 2A, the collimator 50a includes numbers of through holes 51 arranged in a honeycomb shape. That is, the through holes 51 are in the shape of a hexagonal close-packed lattice where numbers of regular hexagons are arranged densely. Moreover, depths and diameters (i.e., aspect ratios) of the through holes 51 are the same all over the collimator 50a. The depth of each through hole 51 is 13 mm, for example, and the diameter is 12.9 mm, for example (aspect ratio is about 1.01). Further, a thickness of a partition wall separating adjacent through holes 51 is 1 mm, for example.

Figure 3:
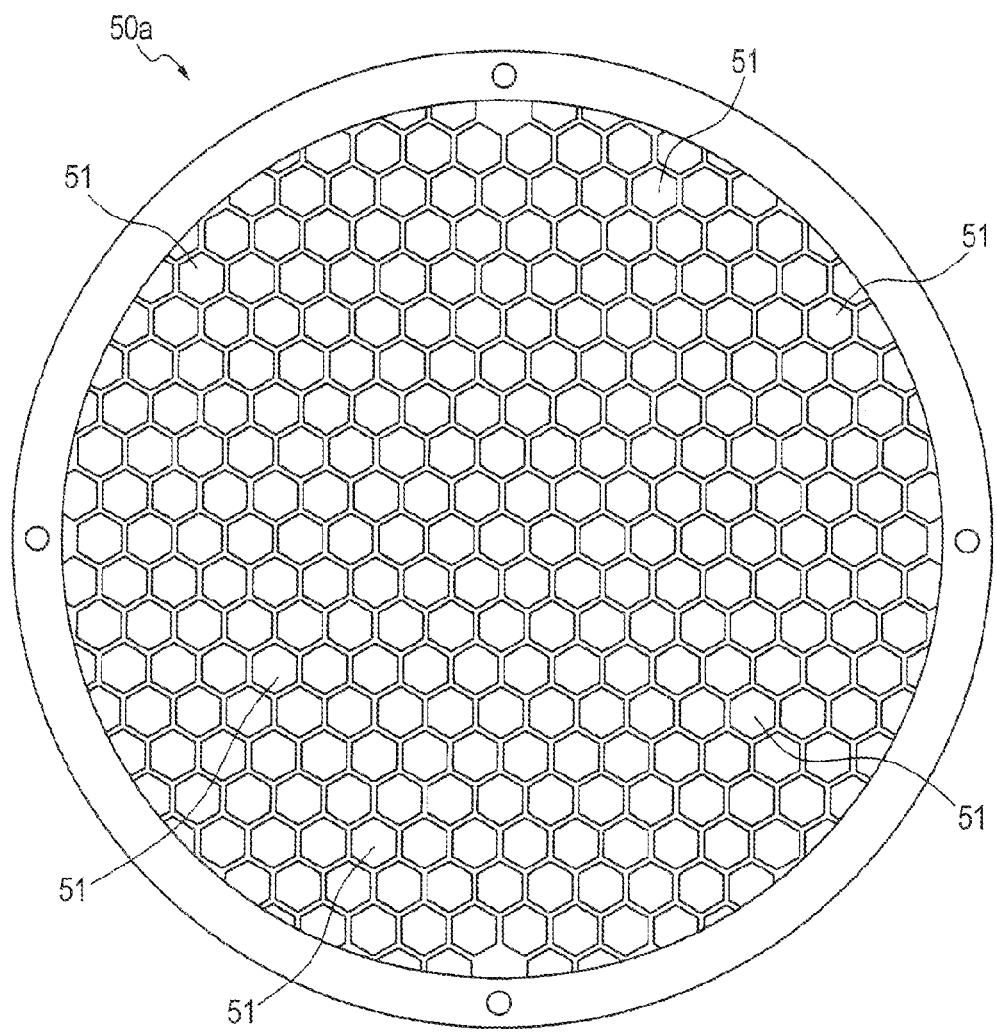
FIG. 3 is a plan view showing a modification of the collimator used in First Embodiment.

In addition, a planar shape of the through hole 51 arranged near the peripheral part of the collimator 50a may be, in accordance with a circumferential shape of the collimator 50a, a shape different from the regular hexagon. For example, as shown in FIG. 3, it may be a shape of a regular hexagon part of which is cut off. Moreover, the planar shape of the through hole 51 is not limited to the regular hexagon or the shape of the regular hexagon part of which is cut off. For example, it may be a rectangle, a square, a rhombus, a circle, and the like.

In the peripheral part of the collimator 50a, there are provided four screw holes 52 for screwing the collimator 50a to the shield 42 of the chamber 41 shown in FIG. 1. As shown in FIG. 2B, the peripheral part of the collimator 50a in which the screw holes 52 are made is thicker than its inner region (a region in which many through holes 51 are made). When a thickness of the inner region of the collimator 50a is 13 mm, a thickness of the peripheral part thereof is, for example, 15 mm.

With regard to the collimator 50a shown in FIG. 2, an undersurface side (a side opposed to the semiconductor wafer SW) of a region in which many through holes 51 are made is thinner than the peripheral part. On the other hand, it is also possible that an upper surface side (a side opposed to the target 48) of the region in which many through holes 51 are made is thinner than the peripheral part. However, the number of sputtered particles (sputtered particles advancing obliquely) entering the main surface of the semiconductor wafer SW in an oblique direction is greater when the undersurface side of the collimator 50a is thinner. That is, an effect of extending a film deposition area for the sputtered particles passing through the collimator 50a and deposited over the semiconductor wafer SW is greater in the case of the collimator 50a shown in FIGS. 2A and 2B than in the case where the upper surface side of the collimator 50a is made thinner.

Next, an explanation will be given to one example of a manufacturing method of a CMOS (Complementary Metal Oxide Semiconductor) type semiconductor including a process of depositing a metal film over the semiconductor wafer SW using the sputtering apparatus 40 including the above collimator 50a. In this regard, there are called a pair of field effect transistors (a pair of field effect transistors whose conductive types are different from each other) configuring the CMOS type integrated circuit an n channel type MISFET (Metal Insulator Semiconductor Field Effect Transistor) and a p channel type MISFET.

Figure 4:
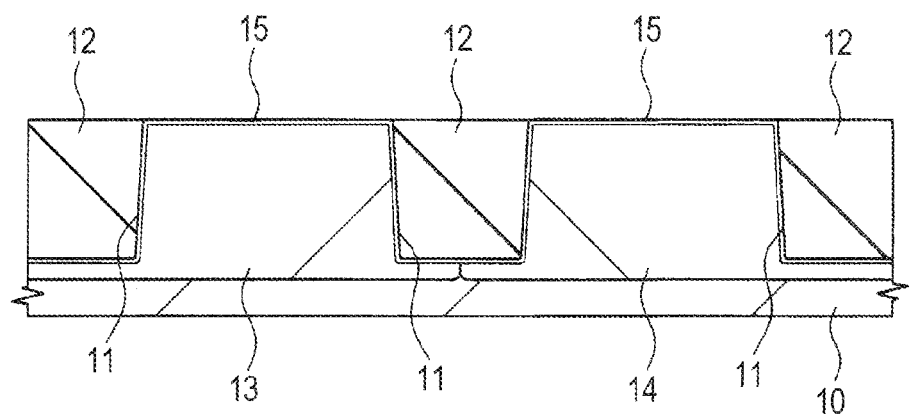
FIG. 4 is a cross-sectional view showing a process of manufacturing a semiconductor device in First Embodiment.

First, as shown in FIG. 4, an element isolation trench 11 is formed in the main surface of the semiconductor substrate (corresponding to the semiconductor wafer SW shown in FIG. 1) 10 including a p type single-crystal silicon which has, for example, a specific resistance of about 1 to 10Ω cm. The element isolation trench 11 is formed as follows. First, a trench is formed by etching the semiconductor substrate 10 in an element isolation region. Then, a silicon oxide film 12 is deposited by a CVD (Chemical Vapor Deposition) method over the semiconductor substrate 10 including the inside of the trench. Subsequently, the element isolation trench 11 is formed by polishing and removing the unnecessary silicon oxide film 12 outside the trench by a CMP (Chemical Mechanical Polishing) method.

Next, a p type well 13 is formed by ion implantation of boron (B) into part of the main surface (n channel type MISFET formation area) of the semiconductor substrate 10 and an n type well 14 is formed by ion implantation of phosphorus (P) into the other part of the main surface (p channel type MISFET formation area) of the semiconductor substrate 10. Then, by steam-oxidizing the semiconductor substrate 10, gate oxide films 15 are formed over surfaces of the p type well 13 and the n type well 14, respectively.

Figure 5:
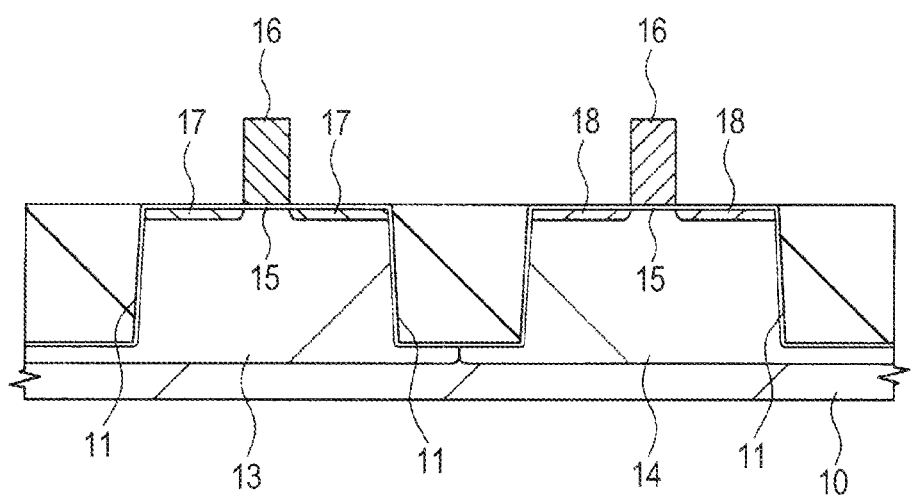
FIG. 5 is a cross-sectional view showing a process of manufacturing the semiconductor device subsequent to FIG. 4.

Next, as shown in FIG. 5, a gate electrode 16 of the n channel type MISFET is formed over the gate oxide film 15 which is formed over the surface of the p type well 13, and a gate electrode 16 of the n channel type MISFET is formed over the gate oxide film 15 formed over the surface of the n type well 14. These gate electrodes 16 are formed as follows. First, a polycrystalline silicon film is deposited over an upper portion of the gate oxide film 15 by the CVD method. Then, by an ion implantation method using a resist pattern as a mask, phosphorus is doped into the polycrystalline silicon film over the upper portion of the p type well 13 and boron is doped into the polycrystalline silicon film over an upper portion of the n type well 14. Subsequently, the polycrystalline silicon film is patterned by dry etching using a resist pattern as a mask.

Next, an n type semiconductor region 17 having a low concentration of impurities is formed by ion implantation of phosphorus or arsenic (As) into a p type well 13, and a p$^-$ type semiconductor region 18 having a low concentration of impurities is formed by ion implantation of boron into an n type well 14.

Figure 6:
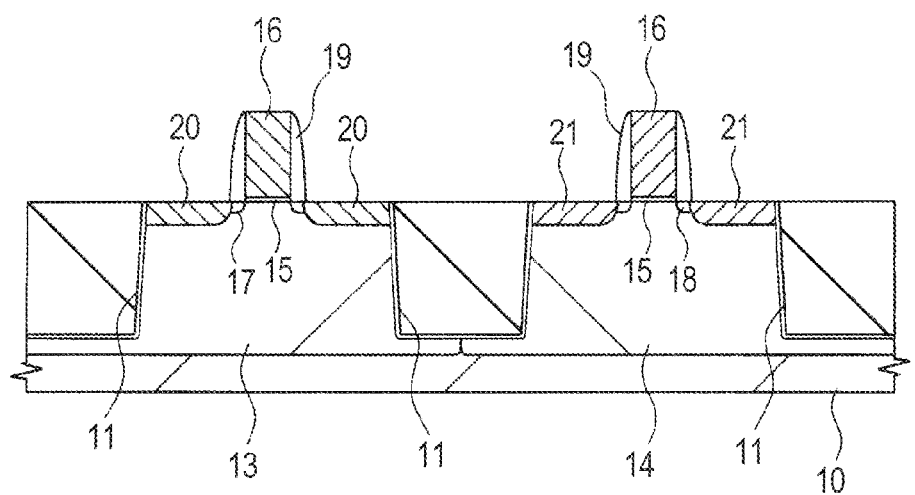
FIG. 6 is a cross-sectional view showing a process of manufacturing the semiconductor device subsequent to FIG. 5.

Next, as shown in FIG. 6, a sidewall spacer 19 is formed over each of the sidewalls of the gate electrode 16 by depositing a silicon nitride film over the semiconductor substrate 10 using the CVD method and performing anisotropic etching of the silicon nitride film. The above etching also removes the thin gate oxide film 15 covering the surface of the n$^-$ type semiconductor region 17 and the surface of the p type semiconductor region 18.

Then, an n$^+$ type semiconductor region (source or drain of the n channel type MISFET) 20 having a high concentration of impurities is formed by ion implantation of phosphorus or arsenic into the p type well 13, and a p$^+$ type semiconductor regions (source or drain of the p channel type MISFET) 21 having a high concentration of impurities is formed by ion implantation of boron into the n type well 14.

Next, the surface of the semiconductor substrate 10 is washed with a buffered hydrofluoric acid type washing liquid. Then, the semiconductor substrate 10 (semiconductor wafer SW) is brought into the chamber 41 of the sputtering apparatus 40 shown in FIG. 1 and is positioned over the wafer stage 46. Moreover, the target 48 containing a high purity Co (cobalt) is fixed to the bottom surface of the backing plate 43.

Figure 7:
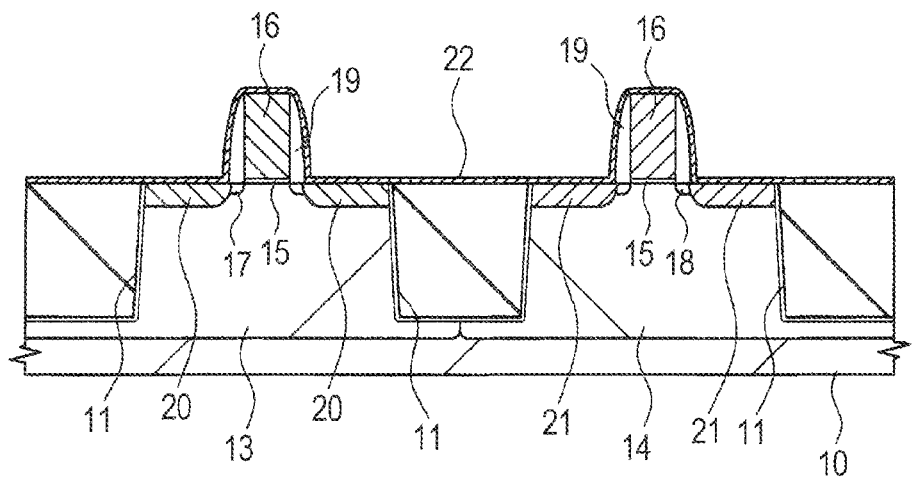
FIG. 7 is a cross-sectional view showing a process of manufacturing the semiconductor device subsequent to FIG. 6.

Subsequently, a negative voltage (negative potential) is impressed to the target 48 after introducing the Ar gas of a predetermined rate of flow (for example, about 70 to 110 sccm) into the chamber 41, while setting the inside of the chamber 41 to a predetermined degree of vacuum (for example, about 1 to $8 \times 10^{-6}$ Pa). As a result, an electric field is produced between the target 48 and the semiconductor wafer SW, and Ar ions in plasma are generated inside the chamber 41. The Ar ions collide with the surface of the target 48 forming the cathode and drive out Co atoms contained in the target 48. When part of the target atoms (sputtered particles) driven out passes through the through holes 51 of the collimator 50a and reaches the main surface of the semiconductor wafer SW, as shown in FIG. 7, a Co film 22 is deposited over the main surface of the semiconductor substrate 10 (semiconductor wafer SW).

Next, with reference to FIG. 8, effects of First Embodiment will be explained. Among the sputtered particles (Co atoms) kicked out from the position of an erosion peak of the target 48, FIG. 8 schematically shows film deposition areas DA of the sputtered particles passing through the collimator and deposited over the semiconductor wafer SW.

As described above, in the case of the magnetron sputtering apparatus 40 in which the sputtering is performed while rotating the magnet arranged above the target 48, an erosion peak EP of the target 48 is produced near a circular region along the trajectory of the rotating magnet. For example, when the magnets are arranged right above a central part, a peripheral part, and an intermediate part thereof, respectively, of the target 48, the erosion peaks EP of the target 48 become three-fold concentric circles as shown in the drawing.

Figure 8:
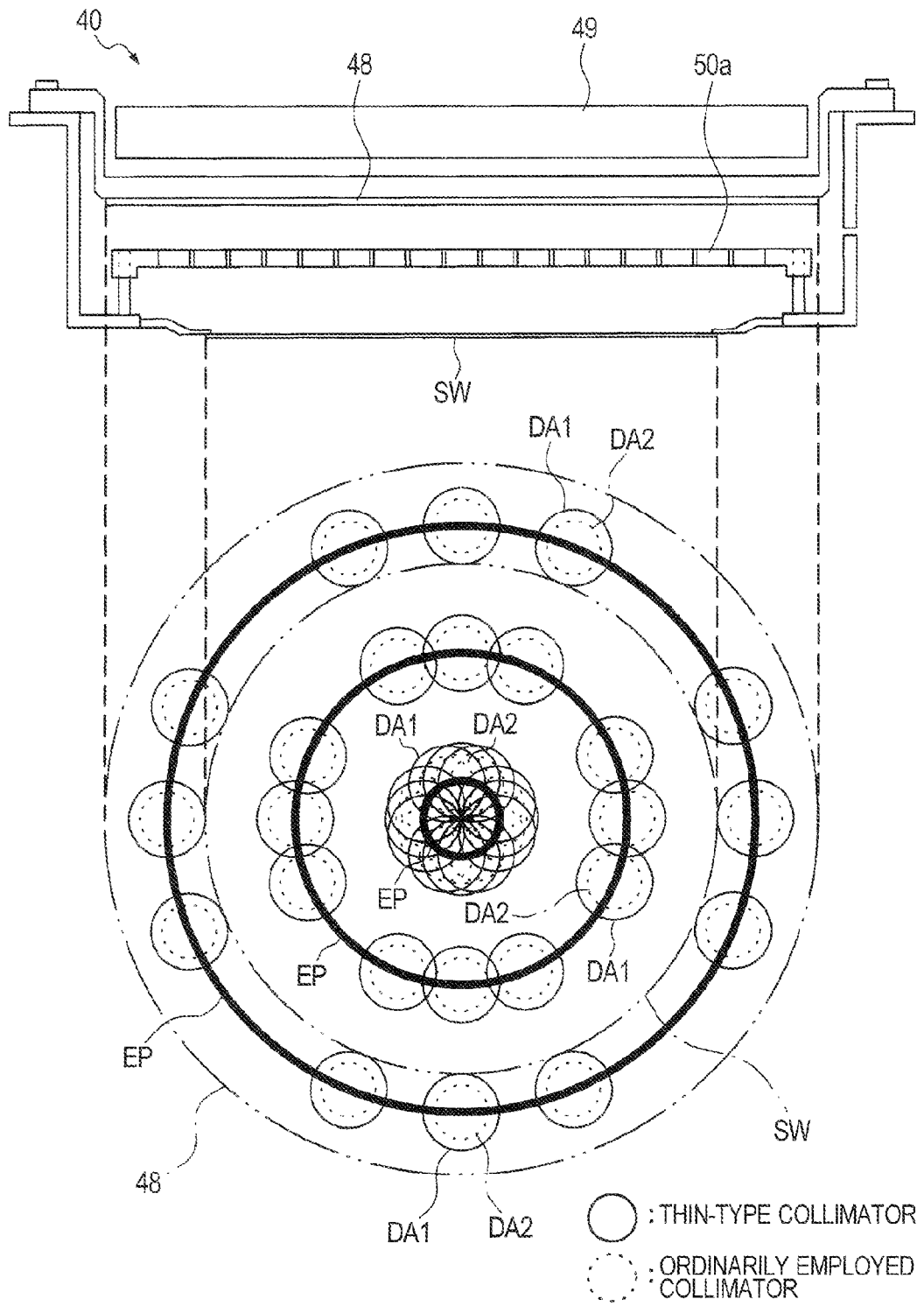
FIG. 8 is an explanatory view showing effects of First Embodiment.

In FIG. 8, solid line circles show film deposition areas DA1 of sputtered particles deposited over the semiconductor wafer SW after passing through the collimator 50a of First Embodiment. Further, broken line circles show film deposition areas DA2 of sputtered particles deposited over the semiconductor wafer SW after passing through an ordinarily employed collimator where a thickness of a peripheral part is the same (15 mm, in this case) as a thickness of a region (a region in which the through holes 51 are made) inner than the peripheral part (a region screwed to the shield 42 of the chamber 41). In this regard, only part of the film deposition areas DA (DA1, DA2) of the sputtered particles deposited over the semiconductor wafer SW is shown.

Depths of all the through holes 51 of the collimator 50a of First Embodiment are shallower (aspect ratios are lower) than those of the ordinarily employed collimator. As a result, the film deposition area DA1 of the sputtered particles passing through the through holes 51 of the collimator 50a of First Embodiment and deposited over the semiconductor wafer SW becomes larger, with respect to all over the semiconductor wafer SW, than the film deposition area DA2 of the sputtered particles passing through the through holes of the ordinarily employed collimator and deposited over the semiconductor wafer SW. In either case, however, in the semiconductor wafer SW, rates at which adjacent film deposition areas DA overlap can be described as follows:

Central part>Intermediate part>Peripheral part

Therefore, when using the collimator 50a of First Embodiment, as compared with the case of using the ordinarily employed collimator, the film thickness is expected to increase at a more centrally located portion of the semiconductor wafer SW. That is, when comparing the film deposition area DA1 of First Embodiment with the ordinarily employed film deposition area DA2, the film thickness difference thereof in the intermediate part is bigger than that in the peripheral part of the semiconductor wafer SW, and the film thickness difference in the central part is bigger than that in the intermediate part.

Consequently, by depositing the Co film 22 (see FIG. 7) over the main surface of the semiconductor substrate 10 (semiconductor wafer SW) with use of the sputtering apparatus 40 having the collimator 50a of First Embodiment, even when the integrated usage of the target 48 has increased, it is possible to secure uniformity of the thickness of the Co film 22 in the wafer plane. That is, according to the present embodiment, uniformity of the thickness of a silicide film in the plane of the semiconductor wafer SW is improved, suppressing variations in resistance of the silicide film and junction leaks. Moreover, the use efficiency of the target 48 is improved and the number of semiconductor wafers SW which can be processed by a single target 48 is increased. As a result, the manufacturing cost of a CMOS type integrated circuit can be reduced.

Next, a manufacturing process subsequent to the one shown in FIG. 7 will be explained. First, by heat-treating the semiconductor substrate 10 over which the Co film 22 is deposited in a non-oxidizing gas atmosphere, the Co film 22 is made to react with the source or drain ($n^+$ type semiconductor region 20) of the n channel type MISFET and the gate electrode 16. Also, the Co film 22 is made to react with the source or drain ($p^+$ type semiconductor region 21) of the p channel type MISFET and the gate electrode 16. Then, non-reacted part of the Co film 22 is removed by wet etching using, for example, a mixture of hydrochloric acid and hydrogen peroxide solution.

Figure 9:
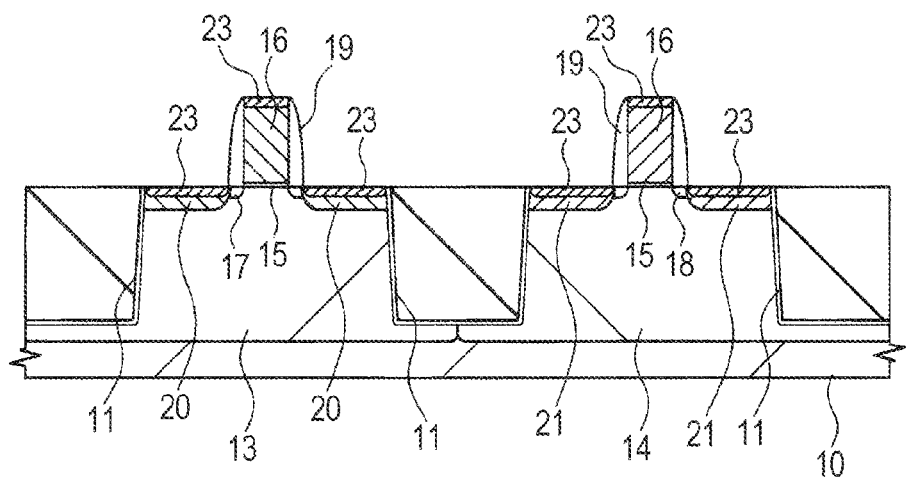
FIG. 9 is a cross-sectional view showing a process of manufacturing the semiconductor device subsequent to FIG. 7.

Consequently, as shown in FIG. 9, Co silicide layers 23 are formed over respective surfaces of the source or drain ($n^+$ type semiconductor region 20) of the n channel type MISFET and the gate electrode 16 and over respective surfaces of the source or drain ($p^+$ type semiconductor region 21) of the p channel type MISFET and the gate electrode 16.

In addition, the silicide layers formed over the surfaces of the source or drain ($n^+$ type semiconductor region 20, $p^+$ type semiconductor region 21) and the gate electrodes 16 are not limited to the Co silicide layers 23. For example, the silicide layer may be a Ni (nickel) silicide layer. In such a case, a Ni film is deposited over the semiconductor substrate 10 (semiconductor wafer SW) with use of the target 48 containing a high purity Ni.

Figure 10:
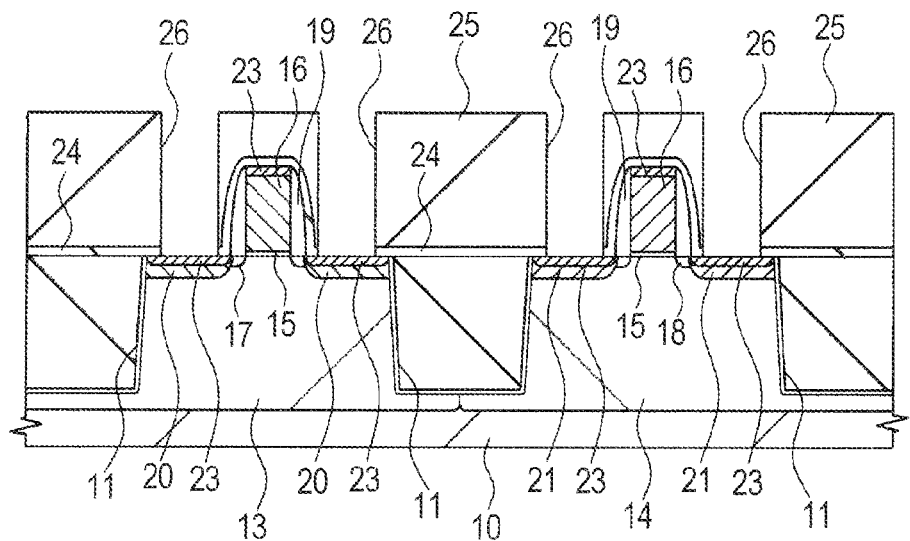
FIG. 10 is a cross-sectional view showing a process of manufacturing the semiconductor device subsequent to FIG. 9.

Next, as shown in FIG. 10, over the semiconductor substrate 10, a silicon nitride film 24 and a silicon oxide film 25 are deposited sequentially using the CVD method. Then, a connection hole 26 is formed by dry etching the silicon oxide film 25 and the silicon nitride film 24 over the upper portions of the source or drain ($n^+$ type semiconductor region 20) of the n channel type MISFET and the source or drain ($p^+$ type semiconductor region 21) of the p channel type MISFET, respectively.

Figure 11:
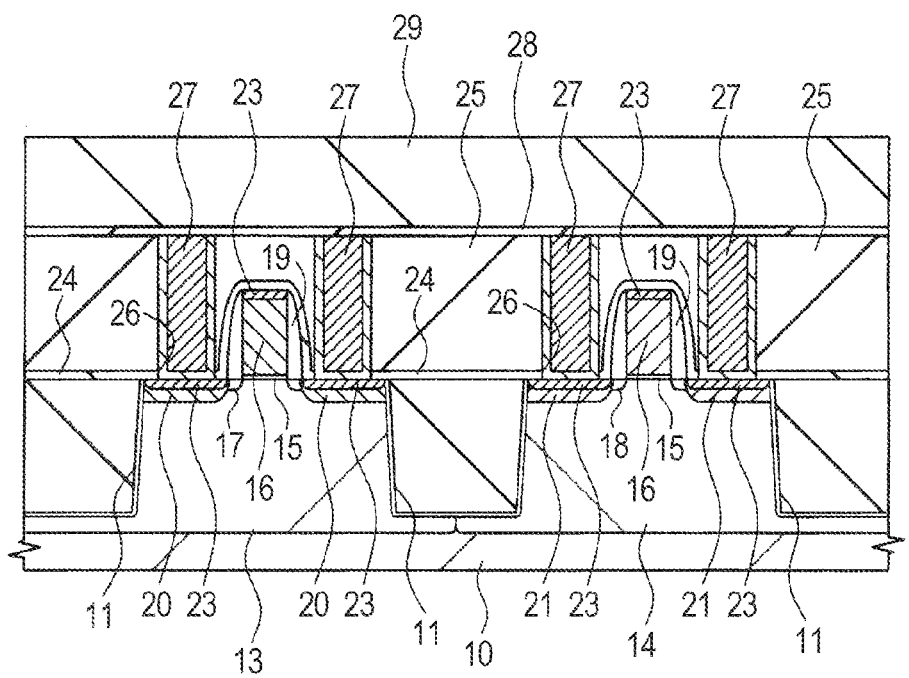
FIG. 11 is a cross-sectional view showing a process of manufacturing the semiconductor device subsequent to FIG. 10.

Next, as shown in FIG. 11, after forming a plug 27 inside the connection hole 26, over an upper portion of the silicon oxide film 25, a silicon nitride film 28 and a silicon oxide film 29 are deposited sequentially using the CVD method. The plug 27 inside the connection hole 26 is formed as follows. First, for example, a titanium nitride film is deposited over the semiconductor substrate 10 by a sputtering method. Then, a tungsten film is deposited over the titanium nitride film using the CVD method. Finally, the plug 27 is formed by removing the titanium nitride film and the tungsten film over the upper portion of the silicon oxide film 25 using the CMP method.

Figure 12:
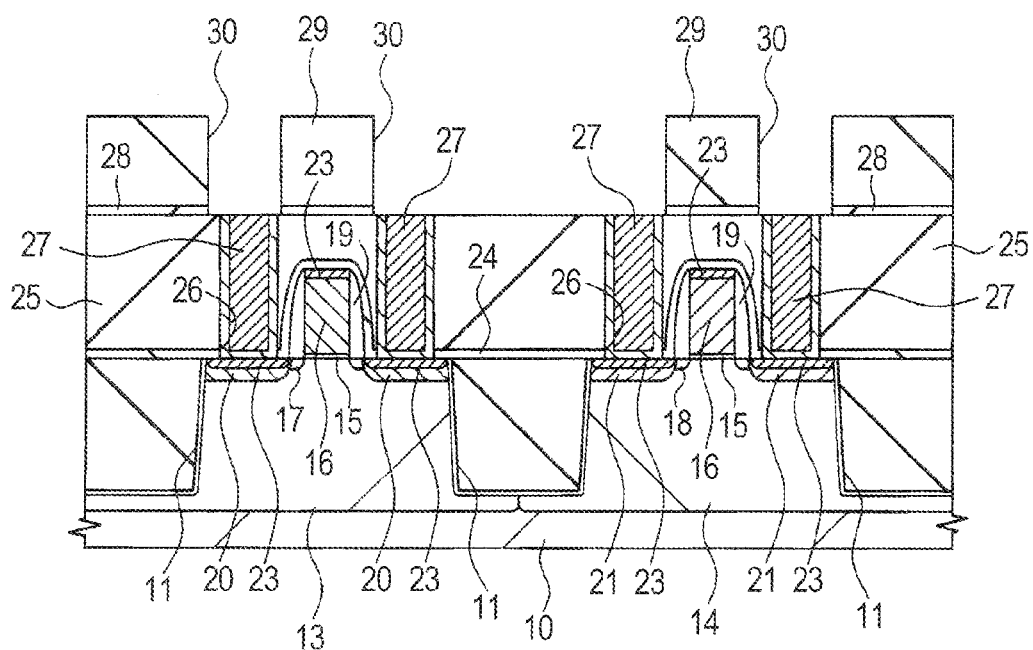
FIG. 12 is a cross-sectional view showing a process of manufacturing the semiconductor device subsequent to FIG. 11.

Next, as shown in FIG. 12, a wiring trench 30 is formed by dry etching the silicon oxide film 29 and the silicon nitride film 28.

Figure 13:
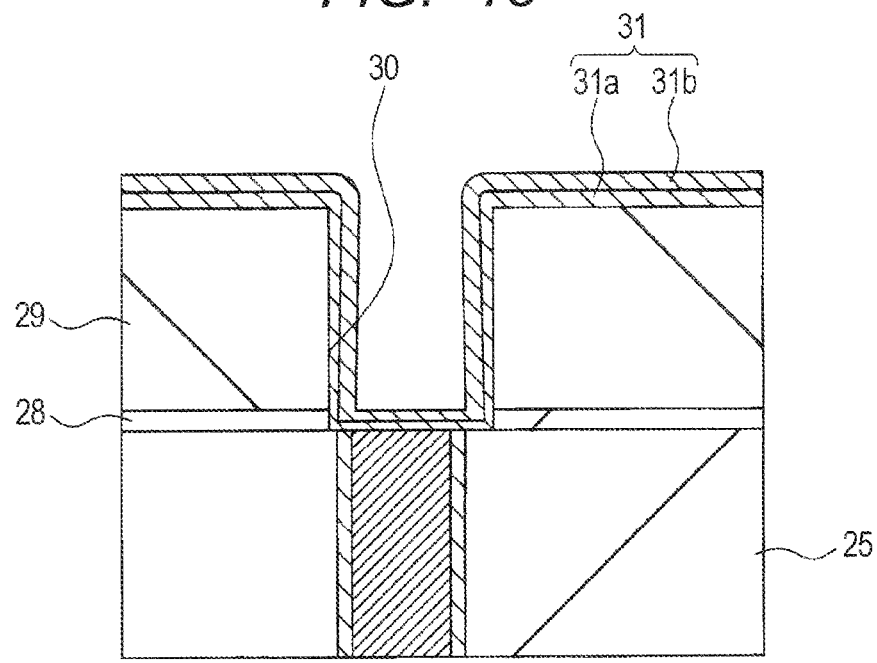
FIG. 13 is a cross-sectional view showing a process of manufacturing the semiconductor device subsequent to FIG. 12.

Next, as shown in FIG. 13 in which a periphery of the wiring trench 30 is enlarged, a conductive film 31 for wiring is formed over the silicon oxide film 29 including the inside of the wiring trench 30. The conductive film 31 is a laminated film including, for example, a barrier conductive film 31*a* containing a Ta (tantalum) film deposited by the sputtering method and the seed film 31*b* containing a Cu (copper) film deposited by the sputtering method.

In this regard, the Ta film configuring the barrier conductive film 31*a* and the Cu film configuring the seed film 31*b* are deposited using the sputtering apparatus 40 having the collimator 50*a* described above. That is, a high purity Ta target is used as a target 48 when depositing the barrier conductive film 31*a*, and a high purity Cu target is used as a target 48 when depositing the seed film 31*b*.

Thus, even when the integrated usage of the target 48 has increased, it becomes possible to secure uniformity of the thickness of the Ta film (barrier conductive film 31*a*) and the Cu film (seed film 31*b*) in the wafer plane. Moreover, the use efficiency of the target 48 is improved and the number of semiconductor wafers SW which can be processed by a single target 48 is increased. As a result, the manufacturing cost of the CMOS type integrated circuit can be reduced.

Figure 14:
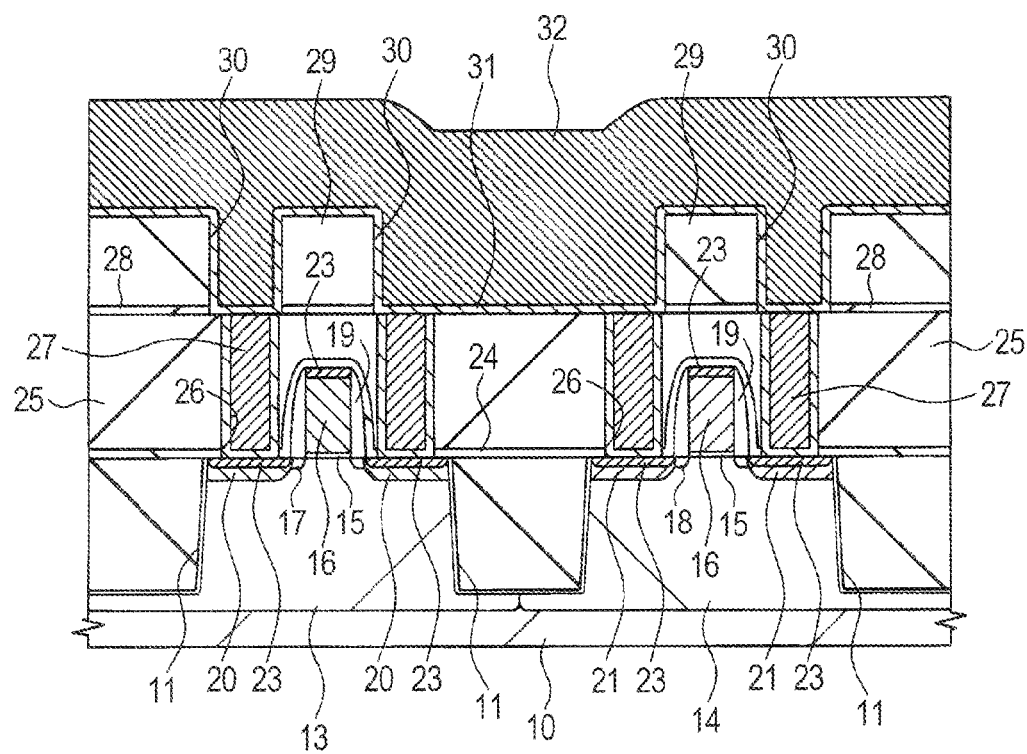
FIG. 14 is a cross-sectional view showing a process of manufacturing the semiconductor device subsequent to FIG. 13.
Figure 15:
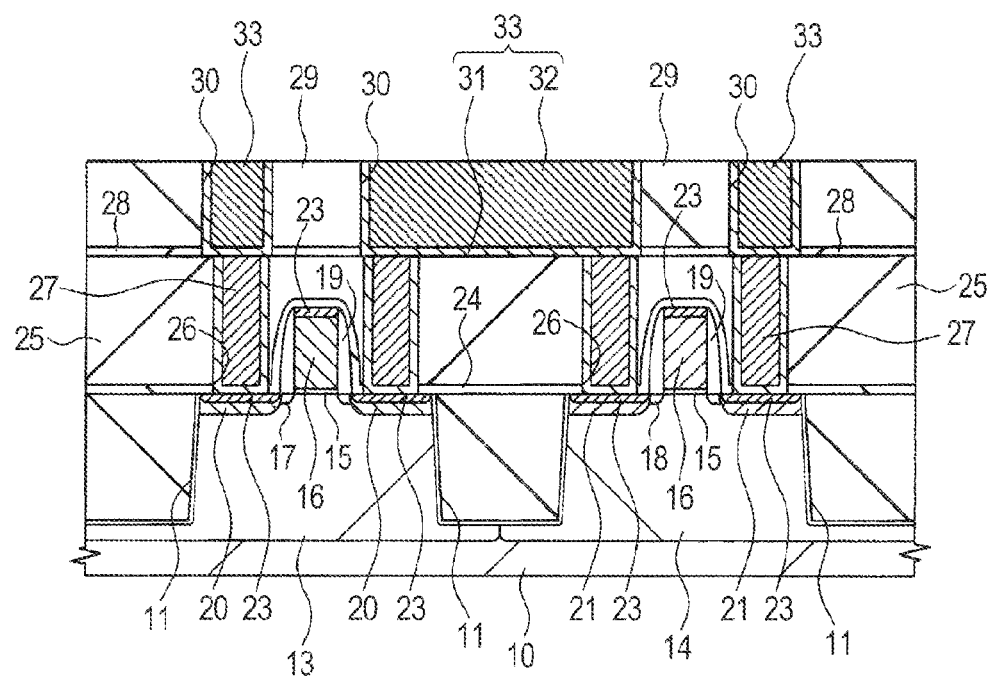
FIG. 15 is a cross-sectional view showing a process of manufacturing the semiconductor device subsequent to FIG. 14.

Next, as shown in FIG. 14, over an upper portion of the conductive film 31, a thick Cu film 32 having a thickness of about 300 nm is deposited by an electrolytic plating method. Then, as shown in FIG. 15, the Cu film 32 and the conductive film 31 outside the wiring trench 30 (upper portion of the silicon oxide film 29) are removed by the CMP method. Thus, an embedded wiring 33 of a laminated film containing the Cu film 32 and the conductive film 31 is formed inside the wiring trench 30. According to the processes so far, the CMOS type integrated circuit is substantially completed.

Second Embodiment

Figure 16:
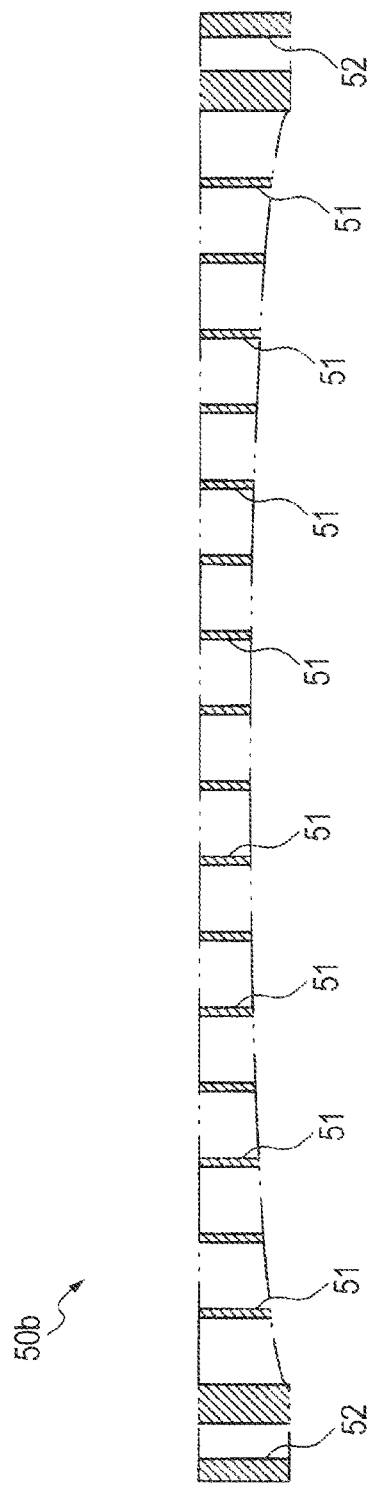
FIG. 16 is a cross-sectional view of a collimator used in Second Embodiment.

FIG. 16 is a cross-sectional view of a collimator 50*b* of the present embodiment. The collimator 50*b* of Second Embodiment is characterized in that its thickness continuously decreases from the peripheral part to the central part. That is, depths of numbers of through holes 51 formed in the collimator 50*b* continuously become shallower from the peripheral part to the central part. On the other hand, diameters of the numbers of through holes 51 are the same in size. Therefore, the aspect ratio of the through holes 51 formed in the collimator 50*b* continuously decreases from the peripheral part to the central part.

According to the collimator 50*b* of Second Embodiment also, as in the collimator 50*a* of First Embodiment, the film thickness is expected to increase at a more centrally located portion of the semiconductor wafer SW. However, the aspect ratio of the through holes 51 arranged near the peripheral part is relatively high. Therefore, it has characteristics that the extension of the film deposition area DA is relatively small in the peripheral part of the semiconductor wafer SW.

As to the collimator 50*b* shown in FIG. 16, its thickness continuously decreases from the peripheral part to the central part. However, the collimator 50*b* may become thinner stepwise (i.e., non-continuously) from the peripheral part to the central part.

In addition, the undersurface side (the side opposed to the semiconductor wafer SW) of the collimator 50*b* shown in FIG. 16 becomes thinner from the peripheral part to the central part. In contrast, however, the upper surface side (the side opposed to the target 48) may become thinner from the peripheral part to the central part.

Third Embodiment

Figure 17A:
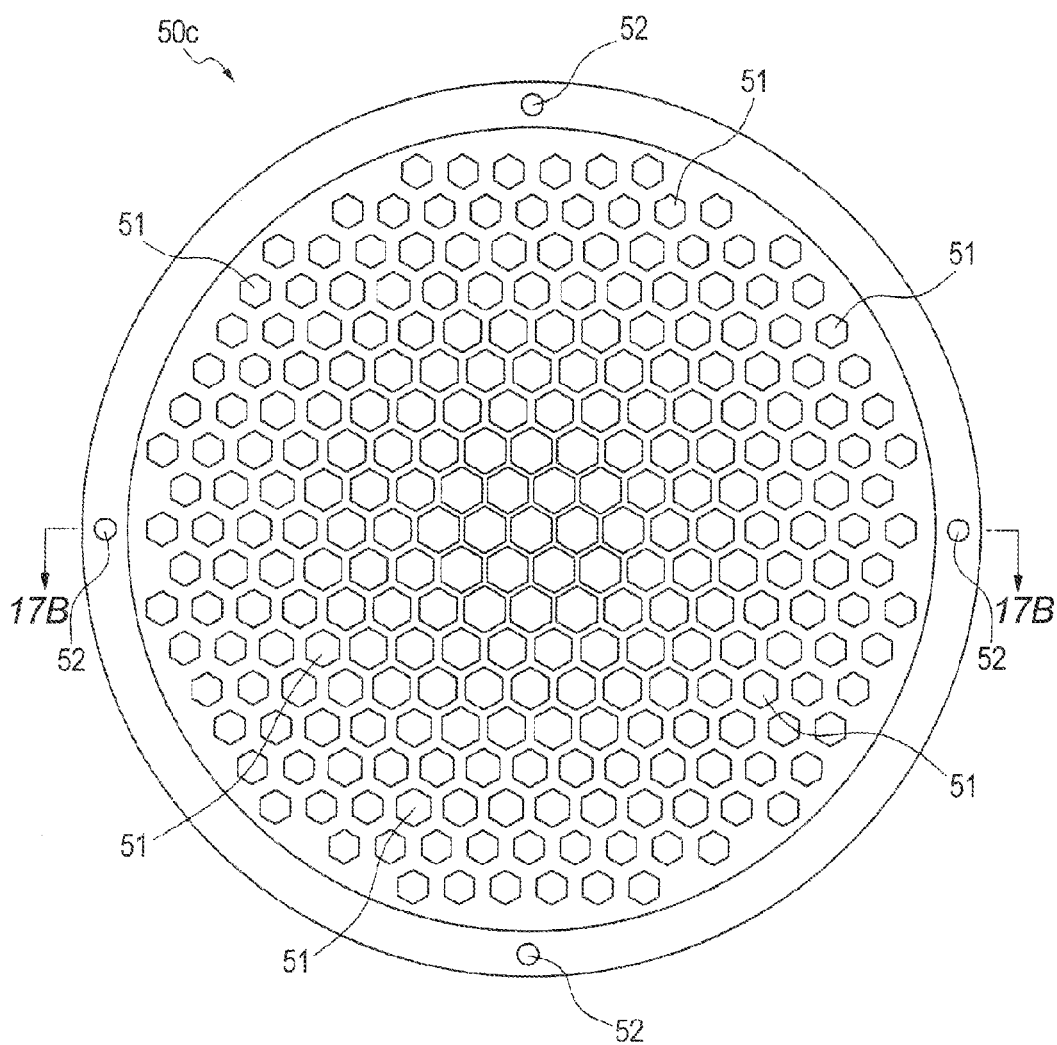
Figure 17B:
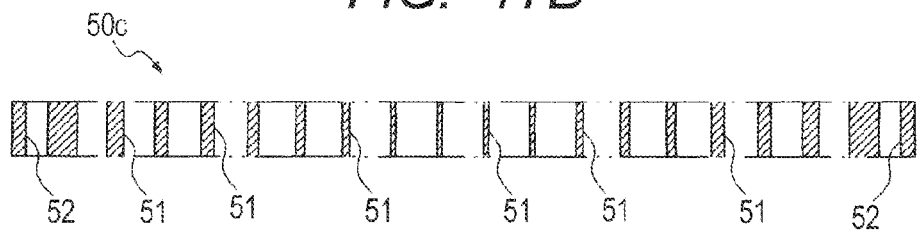

FIGS. 17A and 17B show a collimator 50*c* of Third Embodiment, in which FIG. 17A is a plan view of the collimator 50*c* and FIG. 17B is a cross-sectional view taken along line B-B of FIG. 17A.

The collimator 50*c* according to Third Embodiment is characterized in that the diameters of the through holes 51 continuously increase in size from the peripheral part to the central part but its thickness is uniform on the whole.

Thus, as in the collimator 50*b* of Second Embodiment, the aspect ratio of the through holes 51 of the collimator 50*c* in Third Embodiment continuously decreases from the peripheral part to the central part. Therefore, the effect similar to that of the collimator 50*b* in Second Embodiment can be obtained.

In addition, the thickness of the collimator 50c shown in FIGS. 17A and 17B is uniform on the whole. However, as in the collimator 50a of First Embodiment, the peripheral part alone may be thicker than the inner region thereof. That is, a configuration combined with the configuration of First Embodiment may be adopted. Also, as in the collimator 50b of Second Embodiment, its thickness may continuously decrease from the peripheral part to the central part. That is, a configuration combined with the configuration of Second Embodiment may be adopted.

While the invention achieved by the present inventors has been specifically described above based on the embodiments thereof, the present invention is not limited thereto. It will be appreciated that various changes and modifications can be made in the invention within the scope not departing from the gist thereof.

The phenomenon in which the thin films deposited over the central part of the semiconductor wafer become thinner than those over the peripheral part grows prominent as the integrated usage of the target increases. Therefore, for example, an ordinarily employed collimator may be used at the time of starting to use the target, and it may be switched to one of the collimators of First to Third Embodiments when the integrated usage of the target has increased to a certain degree.

Moreover, although depending on a layout or a size of the magnet mounted to the sputtering apparatus, as the integrated usage of the target increases, there are times when thin films deposited over the central part of the semiconductor wafer become thicker that those deposited over the peripheral part. In the case of depositing a thin film using such a sputtering apparatus, by using a collimator in which a peripheral part is made thinner than an inner region thereof, even when the integrated usage of the target has increased, it becomes possible to secure uniformity in film thickness of the thin film in the wafer plane.

What is claimed is:

1. A method of manufacturing a semiconductor device comprising a step of:
    depositing a thin film containing components for configuring a target over a main surface of a semiconductor wafer with use of a sputtering apparatus which includes: a chamber; a wafer stage installed in the chamber and supporting the semiconductor wafer; the target so installed as to oppose the semiconductor wafer supported by the wafer stage; and a collimator installed in a space between the semiconductor wafer supported by the wafer stage and the target and having a plurality of through holes provided along its thickness direction,
    wherein a region inner than a peripheral part of the collimator is thinner than the peripheral part and has flat top and bottom surfaces,
    depths of the through holes provided in the collimator are identical with one another and diameters of the through holes continuously increase in size from a peripheral part to a central part of the collimator, and
    a distance between adjacent through holes continuously decreases in size from the peripheral part to the central part of the collimator.

2. The method of manufacturing a semiconductor device according to claim 1,
    wherein screw holes for fastening the collimator to the chamber are provided in the peripheral part, and
    wherein the through holes are provided in the region inner than the peripheral part.

3. The method of manufacturing a semiconductor device according to claim 1,
    wherein the collimator has a first surface opposed to the semiconductor wafer and a second surface located on the side opposite to the first surface and opposed to the target,
    wherein the region inner than the peripheral part of the first surface of the collimator is closer to the second surface than the peripheral part, and
    wherein the peripheral part and the region inner than the peripheral part of the second surface of the collimator are in the same plane.

4. The method of manufacturing a semiconductor device according to claim 1, wherein the sputtering apparatus is a magnetron sputtering apparatus in which a magnet is arranged close to the target.

5. The method of manufacturing a semiconductor device according to claim 1, wherein the thin film is a conductive film for a silicide structure formed over the main surface of the semiconductor wafer.

6. The method of manufacturing a semiconductor device according to claim 5, wherein the conductive film is a Co film or a Ni film.

7. The method of manufacturing a semiconductor device according to claim 1, wherein the thin film is a conductive film for a wiring structure formed over the main surface of the semiconductor wafer.

8. The method of manufacturing a semiconductor device according to claim 7, wherein the conductive film is a Cu film.

9. A method of manufacturing a semiconductor device comprising a step of:
    depositing a thin film containing components for configuring a target over a main surface of a semiconductor wafer with use of a sputtering apparatus which includes: a chamber; a wafer stage installed in the chamber and supporting the semiconductor wafer; the target so installed as to oppose the semiconductor wafer supported by the wafer stage; and a collimator installed in a space between the semiconductor wafer supported by the wafer stage and the target and having a plurality of through holes provided along its thickness direction,
    wherein depths of the through holes provided in the collimator are identical with one another and diameters of the through holes continuously increase in size from a peripheral part to a central part of the collimator, and
    a distance between adjacent through holes continuously decreases in size from the peripheral part to the central part of the collimator.

10. A sputtering apparatus comprising:
    a chamber;
    a wafer stage installed in the chamber and supporting a semiconductor wafer; and
    a collimator installed above the wafer stage and having a plurality of through holes provided along its thickness direction,
    wherein a peripheral part of the collimator is thicker than a region inner than the peripheral part and has flat top and bottom surfaces,
    diameters of the through holes continuously increase in size from the peripheral part to the central part of the collimator, and
    a distance between adjacent through holes continuously decreases in size from the peripheral part to the central part of the collimator.

11. The sputtering apparatus according to claim 10,
    wherein screw holes for fastening the collimator to the chamber are provided in the peripheral part of the collimator, and wherein the through holes are provided in the region inner than the peripheral part.

12. The sputtering apparatus according to claim 10, wherein the collimator has a first surface opposed to the wafer stage and a second surface located on the side opposite to the first surface,
wherein the first surface in the region inner than the peripheral part is closer to the second surface than the first surface in the peripheral part, and
wherein the peripheral part and the region inner than the peripheral part of the second surface are in the same plane.

13. A sputtering apparatus according to claim 10, wherein a magnet is arranged above the collimator.

14. A sputtering apparatus comprising:
a chamber;
a wafer stage installed in the chamber and supporting a semiconductor wafer; and
a collimator installed above the wafer stage and having a plurality of through holes provided along its thickness direction,
wherein diameters of the through holes continuously increase in size from a peripheral part of the collimator to a central part of the collimator, and
a distance between adjacent through holes continuously decreases in size from the peripheral part to the central part of the collimator.

15. The method of manufacturing a semiconductor device according to claim 10, wherein the thickness of the collimator continuously decreases from the peripheral part of the collimator to a central part thereof.

16. The sputtering apparatus according to claim 14, wherein the thickness of the collimator continuously decreases from the peripheral part to the central part of the collimator.

* * * * *